United States Patent
Tajima

(10) Patent No.: US 10,419,012 B2
(45) Date of Patent: Sep. 17, 2019

(54) PEAK/BOTTOM DETECTION CIRCUIT, A/D CONVERTER, AND INTEGRATED CIRCUIT

(71) Applicant: SOCIONEXT INC., Yokohama-shi, Kanagawa (JP)

(72) Inventor: Akimitsu Tajima, Yokohama (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 16/160,513

(22) Filed: Oct. 15, 2018

(65) Prior Publication Data

US 2019/0229744 A1 Jul. 25, 2019

(30) Foreign Application Priority Data

Jan. 24, 2018 (JP) ................................. 2018-009781

(51) Int. Cl.
*H03M 1/12* (2006.01)
*H03K 5/24* (2006.01)

(52) U.S. Cl.
CPC .......... *H03M 1/124* (2013.01); *H03K 5/2472* (2013.01)

(58) Field of Classification Search
CPC ............................ H03M 1/124; H03K 5/2472
USPC .................................................. 341/130–155
See application file for complete search history.

(56) References Cited

U.S. PATENT DOCUMENTS

| | | | |
|---|---|---|---|
| 3,947,761 A | 3/1976 | Arai | |
| 2005/0200510 A1* | 9/2005 | Yoshida | ............. H03M 1/1245 341/155 |
| 2006/0125673 A1* | 6/2006 | Lee | .......................... H03K 4/50 341/155 |
| 2006/0208935 A1* | 9/2006 | Hurrell | ................. H03M 1/145 341/155 |
| 2008/0074153 A1* | 3/2008 | Hakomori | ............ G01R 31/021 327/58 |
| 2010/0225509 A1* | 9/2010 | Gicquel | ................ H03M 1/164 341/110 |
| 2014/0077985 A1* | 3/2014 | Tokunaga | ............... H03M 3/32 341/143 |

FOREIGN PATENT DOCUMENTS

| | | |
|---|---|---|
| JP | 50-045672 | 4/1975 |
| JP | 52-008475 U | 1/1977 |
| JP | 52-043379 | 4/1977 |
| JP | 04-031771 A | 2/1992 |
| JP | 2000-171495 A | 6/2000 |
| JP | 2003-215173 A | 7/2003 |
| JP | 2010-085328 A | 4/2010 |

* cited by examiner

*Primary Examiner* — Lam T Mai
(74) *Attorney, Agent, or Firm* — Arent Fox LLP

(57) ABSTRACT

A peak/bottom detection circuit is disclosed. A comparator compares a voltage of one of three or more capacitors with an input voltage. A calculation amplifier amplifies the voltage of one of the three or more capacitors. Each of three or more switches respectively corresponding to the three or more capacitors connects a corresponding capacitor among the three or more capacitors to one of the comparator, the calculation amplifier, and a source of the input voltage. A controller generates control signals for sequentially switching connection destinations of the three or more capacitors and to supply the control signals to the three or more switches, respectively, in which the connection destinations of three capacitors among the three or more capacitors are different from each other.

7 Claims, 11 Drawing Sheets

| SWn_P | SWn_D | SWn_H | CONNECTION DESTINATION OF C |
|---|---|---|---|
| H | L | L | P |
| L | H | L | D |
| L | L | H | H |

| MODE | CMPO | SWP | SWB |
|---|---|---|---|
| L | L | L | L |
| L | H | L | H |
| H | L | L | L |
| H | H | H | L |

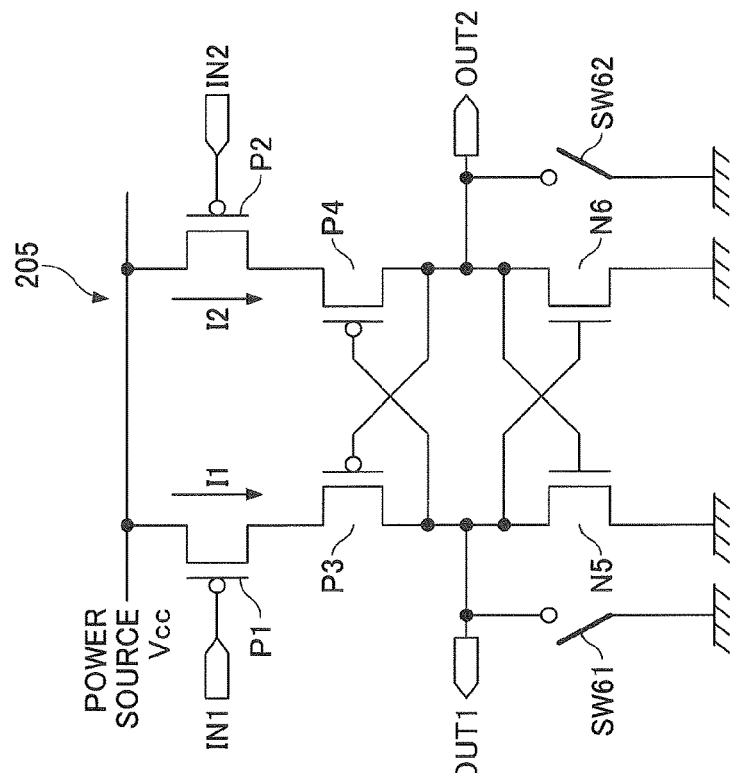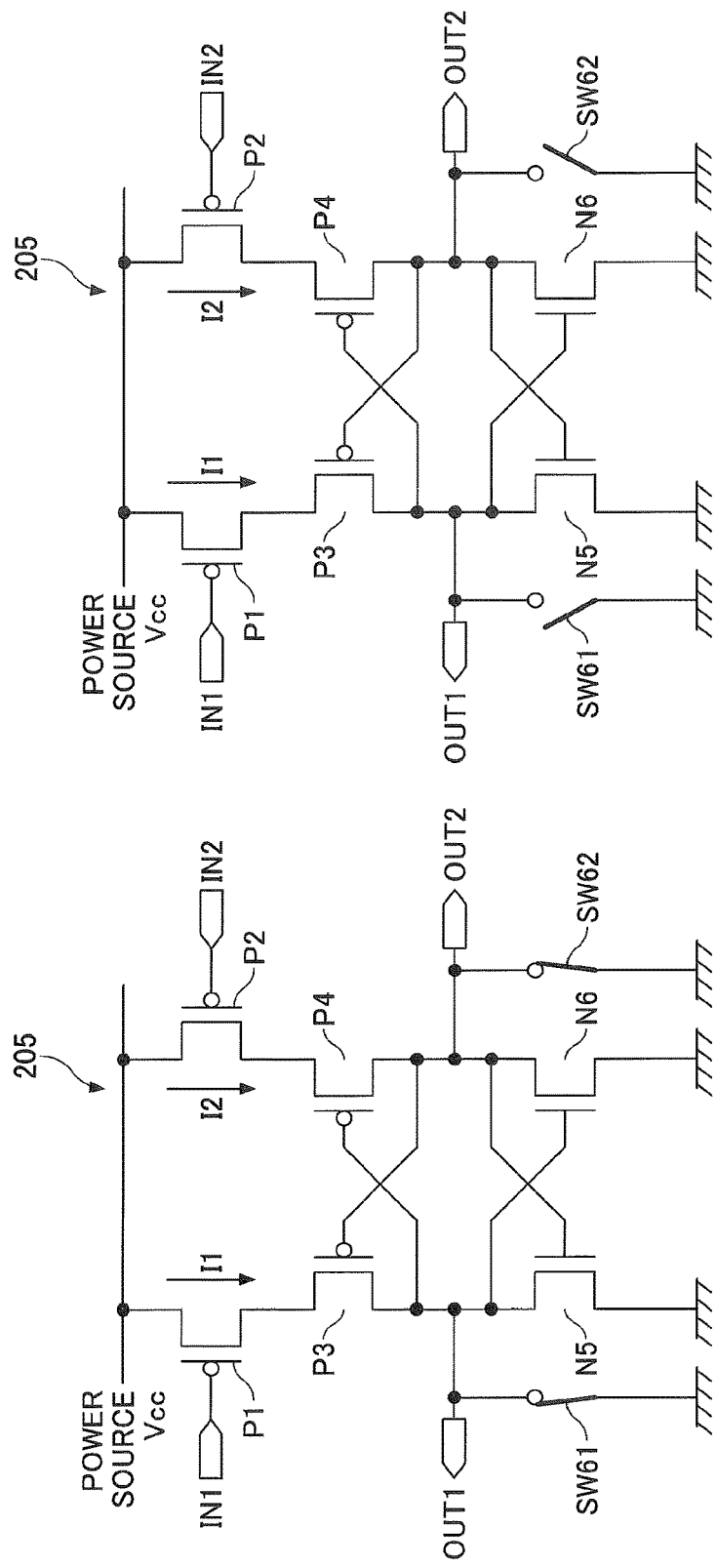

PEAK/BOTTOM DETECTION CIRCUIT, A/D CONVERTER, AND INTEGRATED CIRCUIT

CROSS-REFERENCE TO RELATED APPLICATIONS

This application is based on and claims the benefit of priority of the prior Japanese Patent Application No. 2018-009781, filed on Jan. 24, 2018, the entire contents of which are incorporated herein by reference.

BACKGROUND OF THE INVENTION

1. Field of the Invention

The disclosures herein relate to a peak/bottom detection circuit, an A/D converter, and an integrated circuit.

2. Description of the Related Art

Conventionally, a technology has been known in which an Analog to Digital (A/D) converter is connected to a subsequent stage of a peak hold circuit including a comparator and a capacitor, and a peak value of a voltage is acquired by converting a voltage output as an analog amount from the peak hold circuit into a digital value.

RELATED-ART DOCUMENTS

Patent Document

[Patent Document 1] Japanese Laid-open Patent Publication No. H04-31771
[Patent Document 2] Japanese Laid-open Patent Publication No. 2003-215173

SUMMARY OF THE INVENTION

According to an embodiment, a peak/bottom detection circuit, including three or more capacitors; a comparator configured to compare a voltage of one of the three or more capacitors with an input voltage; a calculation amplifier configured to amplify a voltage of one of the three or more capacitors; three or more switches respectively corresponding to the three or more capacitors, each of the three or more switches configured to connect a corresponding capacitor among the three or more capacitors to one of the comparator, the calculation amplifier, and a source of the input voltage; and a controller configured to generate control signals for sequentially switching connection destinations of the three or more capacitors and to supply the control signals to the three or more switches, respectively, in which the connection destinations of three capacitors among the three or more capacitors are different from each other.

BRIEF DESCRIPTION OF THE DRAWINGS

Other objects and further features of the present invention will be apparent from the following detailed description when read in conjunction with the accompanying drawings, in which:

FIG. 6A and FIG. 6B are diagrams for explaining an example of a comparator.

DESCRIPTION OF THE PREFERRED EMBODIMENTS

In a conventional method described above, a dead time occurs where a peak hold circuit is not able to detect a peak of a voltage. Specifically, periods of a dead time correspond to a period for an Analog to Digital (A/D) converter to sample outputs of the peak hold circuit, and a settling period for bringing a voltage of a capacitor, which is reset when the sampling ends, close to a voltage of a detection target.

In the following, embodiments of the invention will be described with reference to the accompanying drawings. The embodiments described below enable control against occurrences of dead time.

First Embodiment

Figure 1:
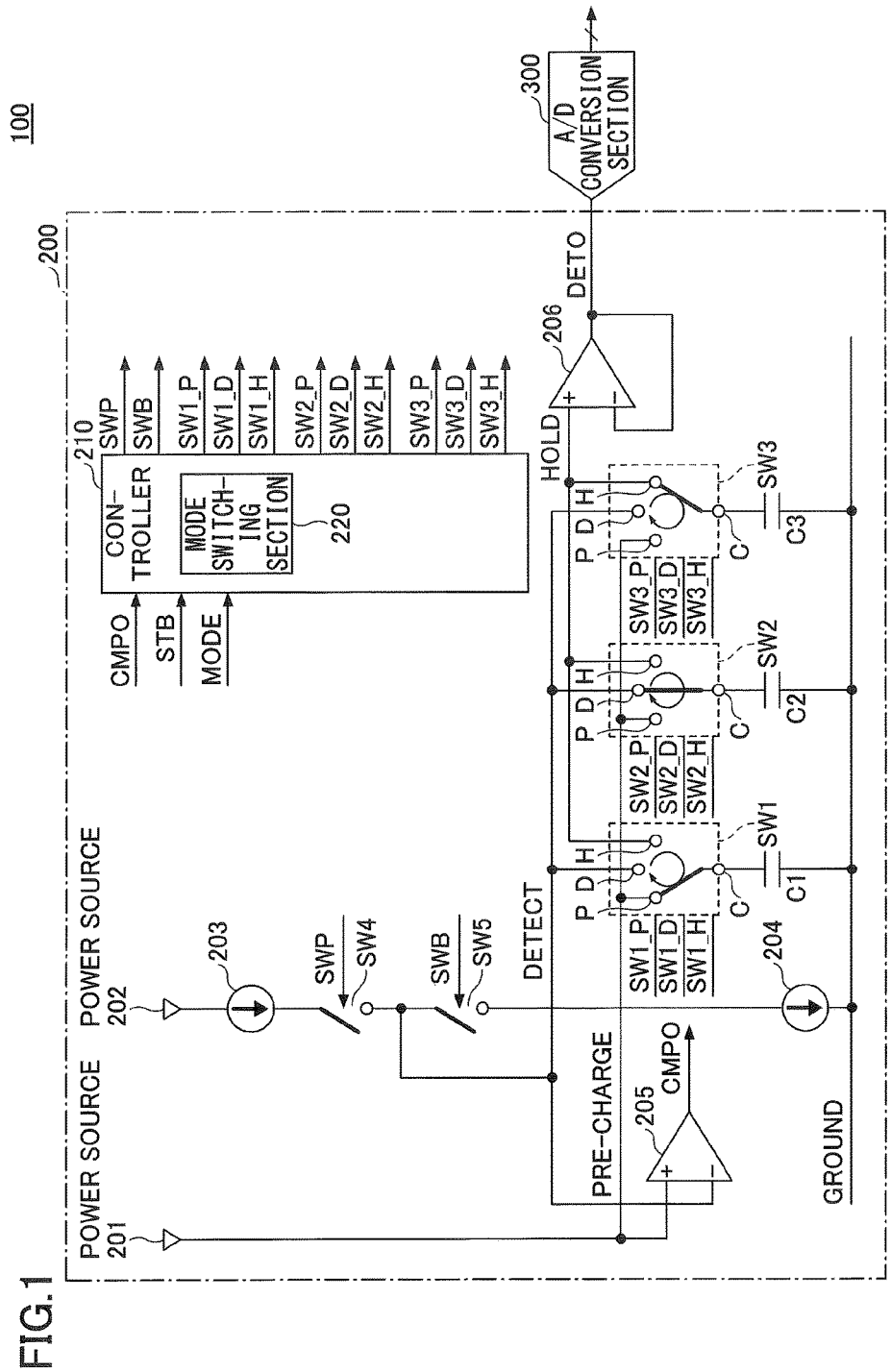
FIG. 1 is a diagram illustrating an Analog to Digital (A/D) converter of a first embodiment.

Referring to drawings, a first embodiment will be described below. FIG. 1 is a diagram illustrating an Analog to Digital (A/D) converter of the first embodiment.

An A/D converter 100 of the first embodiment includes a peak/bottom detection circuit 200, and an A/D conversion section 300. The A/D converter 100 outputs a value acquired by converting a voltage output as an analog signal from the peak/bottom detection circuit 200 into a digital value by the A/D conversion section 300.

The peak/bottom detection circuit 200 of the first embodiment includes power sources 201 and 202, current sources 203 and 204, a comparator 205, a calculation amplifier 206, a controller 210, capacitors C1, C2, and C3, switches SW1, SW2, SW3, SW4, and SW5, which are collectively called switches SWn (n=1, 2, 3, 4, and 5).

The power source 201 outputs a power voltage to be targeted (to be a monitor target) to detect a peak value and a bottom value by the peak/bottom detection circuit 200. In the first embodiment, a voltage to be targeted to detect the peak value or the bottom value by the peak/bottom detection circuit 200 is regarded as, but not limited to, the power voltage output from the power source 201. The peak/bottom detection circuit 200 detects the peak value or the bottom value of the voltage input to a non-inverting input terminal of the comparator 205; however, this voltage may be that output from any device.

In the peak/bottom detection circuit 200, the non-inverting input terminal of the comparator 205 is connected to the power source 201. Also, an inverting input terminal of the comparator 205 is connected to the switches SW1, SW2, and SW3. Moreover, the inverting input terminal of the comparator 205 is connected to a connection point with the switch SW4 and the switch SW5. An output terminal of the comparator 205 is connected to the controller 210. In other words, a CMPO signal, which is an output signal output from the comparator 205, is supplied to the controller 210.

For instance, the comparator 205 of the first embodiment is preferably a comparator having a response speed of 1 [nsec] or more. Moreover, for instance, the comparator 205 of the first embodiment may be realized by causing a clocked comparator to conduct a self-excited operation.

The switch SW4 is connected between the current source 203 coupled to the power source 202 and the switch SW5. The switch SW5 is connected between the switch SW4 and the current source 204 coupled to a ground.

The current source 203 charges and discharges the capacitors C1 to C3 through the switch SW4 in a peak detection mode, which will be described later. Moreover, the current source 204 charges and discharges the capacitors C1 to C3 through the switch SW5. A speed of a charge and a discharge by the current sources 203 and 204 may be approximately 100 [mV/nSec].

In the calculation amplifier 206, one input terminal is connected to the switches SW1, SW2, and SW3, and another input terminal inputs an output signal of an output terminal of the calculation amplifier 206, so as to form a voltage follower circuit. The output terminal of the calculation amplifier 206 is connected to an input terminal of the A/D conversion section 300, and a DETO signal, which is an output signal of the calculation amplifier 206, is supplied to the A/D conversion section 300.

For instance, the calculation amplifier 206 of the first embodiment is preferably an operational amplifier responding at approximately 100 [mV/μSec]. Moreover, the calculation amplifier 206 of the first embodiment amplifies a voltage value of a capacitor Cn at a hold stage described later, and outputs the amplified voltage to the A/D conversion section 300 of a subsequent stage.

The capacitor C1 is connected between the switch SW1 and the ground, the capacitor C2 is connected between the switch SW2 and the ground, and the capacitor C3 is connected between the switch SW3 and the ground.

Each of the switches SW1, SW2, and SW3 includes a terminal P, a terminal D, a terminal H, and a terminal C. Terminals C of the switches SW1, SW2, and SW3 are connected to corresponding capacitors C1, C2, and C3, respectively.

Moreover, in each of the switches SW1, SW2, and SW3, the terminal P is connected to the power source 201, the terminal D is connected to the inverting input terminal of the comparator 205, and the terminal H is connected to the one input terminal of the calculation amplifier 206.

Each of the switches SW1, SW2, and SW3 of the first embodiment connects the terminal C to any one of the terminal P, the terminal D, and the terminal H in response to control signals SWn_P, SWn_D, and SWn_H (n=1, 2, or 3) supplied from the controller 210.

In other words, the switches SW1, SW2, and SW3 connect the capacitor C1, C2, and C3, respectively, to one of the power source 201, the comparator 205, and the calculation amplifier 206, in response to the control signals SWn_P, SWn_D, and SWn_H supplied from the controller 210.

At this time, the controller 210 generates, for each of the switches SW1, SW2, and SW3, the control signals SWn_P, SWn_D, and SWn_H so as to connect the terminal C to a different connection destination.

For instance, the controller 210 controls the switch SW2 to connect the terminal C to the terminal D and controls the switch SW3 to connect the terminal C to the terminal H, in a case of connecting the terminal C to the terminal P at the switch SW1. Moreover, the controller 210 connects the terminal C of the switch SW2 to the terminal P and connects the terminal C of the switch SW3 to the terminal H in a case of connecting the terminal C to the terminal D at the switch SW1.

As described above, the controller 210 switches the connection destination of the terminal C in order so as to differentiate the connection destinations of the terminals C, respectively, at the switches SW1, SW2, and SW3. In other words, the controller 210 of the first embodiment subsequently switches the connection destinations of the capacitors C1, C2, and C3 by the switches SW1, SW2, and SW3.

At the switch SW4 of the first embodiment, ON and OFF (connection and disconnection) are controlled by a control signal SWP supplied from the controller 210. At the switch SW5, ON and OFF (connection and disconnection) are controlled by a control signal SWB supplied from the controller 210.

The CMPO signal, a STB (strobe) signal, and a MODE signal are input to the controller 210 of the first embodiment. Moreover, the controller 210 generates and outputs the control signals SWn_P, SWn_D, and SWn_H, and the control signals SWP and SWB. Also, the controller 210 of the first embodiment includes a mode switching section 220.

The mode switching section 220 of the first embodiment switches an operation mode of the peak/bottom detection circuit 200 in response to the MODE signal. The peak detection mode is a mode that detects the peak value of the power voltage of the power source 201, and a bottom detection mode is a mode that detects the bottom value of the power voltage of the power source 201. Moreover, the controller 210 of the first embodiment generates the control signal SWP and the control signal SWB in response to the MODE signal and the CMPO signal.

The CMPO signal is regarded as an output signal of the comparator 205. In other words, the CMPO signal is a signal that indicates a result from comparing the voltage supplied from the power source 201 with a voltage of any one of the capacitors C1 to C3 connected to the comparator 205.

The STB (strobe) signal is regarded as a timing signal to read data. More specifically, the STB signal corresponds to a timing signal to read the voltage of the capacitor Cn connected to the calculation amplifier 206. For instance, the STB signal may be input from a high-level device or the like of the peak/bottom detection circuit 200.

The MODE signal is a signal that sets an operation mode of the peak/bottom detection circuit 200 to the peak detection mode or the bottom detection mode. The MODE signal may be input from the a high-level device or the like of the peak/bottom detection circuit 200.

The peak/bottom detection circuit 200 of the first embodiment detects the peak value of the power voltage output from the power source 201 in a case in which the peak detection mode is selected by the MODE signal, and detects the bottom value of the power voltage output from the power source 201 in a case in which the bottom detection mode is selected by the MODE signal.

The control signals SWn_P, SWn_D, and SWn_H are generated based on the STB signal and the CMPO signal output from the comparator 205. Each of the switches SW1, SW2, and SW3 of the first embodiment switches the connection destination (the terminal P, the terminal D, and the terminal H) of the terminal C in response to the control signals SWn_P, SWn_D, and SWn_H.

The A/D conversion section 300 of the first embodiment corresponds to an A/D converter having lower power, and converts a voltage, which is indicated by the DETO signal output from the calculation amplifier 206, into a digital value.

Next, referring to FIG. 2, the switches SW1, SW2, and SW3 of the first embodiment will be described. FIG. 2A and FIG. 2B are diagrams for explaining the switches SW1, SW2, and SW3 of the first embodiment. FIG. 2A is a diagram illustrating the switches SW1, SW2, and SW3, and FIG. 2B illustrates a truth table.

Figures 2A, 2B:
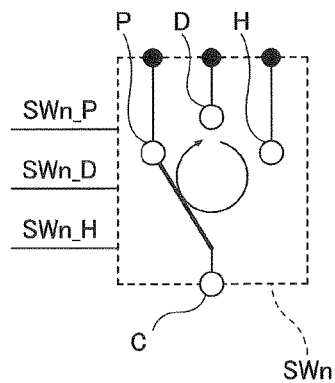
FIG. 2A and FIG. 2B are diagrams for explaining switches of the first embodiment

As illustrated in FIG. 2A, the switches SWn of the first embodiment determine the connection destination of the terminal C as one of the terminal P, the terminal D, and the terminal H, depending on respective values of the control signals SWn_P, SWn_D, and SWn_H. Relationships between respective values of the control signals SWn_P, SWn_D, and SWn_H and the connection destination in the switch SWn are indicated in a truth table 21 in FIG. 2B. A relationship that is not indicated in the truth table 21 is not defined.

In the switches SWn of the first embodiment, the terminal C is connected to the terminal P in a case in which a value of the control signal SWn_P is a high level (hereinafter, called "H level"), a value of the control signal SWn_D is a low level (hereinafter, called "L level"), and a value of the control signal SWn_H is the L level. That is, the capacitor Cn is connected to the power source 201, and is charged (pre-charged) by the voltage supplied from the power source 201.

Moreover, in the switch SWn, the terminal C is connected to the terminal D in a case in which the value of the control signal SWn_P is the L level, the value of the control signal SWn_D is the H level, and the value of the control signal SWn_H is the L level. That is, the capacitor Cn is connected to the inverting terminal of the comparator 205. In the peak/bottom detection circuit 200, in response to connecting the capacitor Cn to the comparator 205, the power voltage and the voltage of the capacitor Cn are compared, and the peak value or the bottom value of the power voltage is detected.

Moreover, in the switch SWn, the terminal C is connected to the terminal H in a case in which the value of the control signal SWn_P is the L level, the value of the control signal SWn_D is the L level, and the value of the control signal SWn_H is the H level. That is, the capacitor Cn is connected to one input terminal of the calculation amplifier 206, and the DETO signal depending on the voltage of the capacitor Cn is output from the calculation amplifier 206 to the A/D conversion section 300.

As described above, in the peak/bottom detection circuit 200, the switch SWn is switched in accordance with the control signals SWn_P, SWn_D, and SWn_H, whereby three states are defined with respect to the capacitors Cn (n=1, 2, and 3), respectively.

The three states correspond to a state of pre-charging the capacitor Cn, a state (of setting) until the peak value or the bottom value of the power voltage is detected from bringing the voltage of the capacitor Cn close to the power voltage, and a state (hold state) for maintaining a voltage value of the capacitor Cn in order for the A/D conversion section 300 to conduct the sampling. In the following, the state of pre-charging the capacitor Cn is called "pre-charge state", the state of detecting the peak value or the bottom value is called "detection state", and the state of maintaining the voltage value of the capacitor Cn is called "hold state".

In the peak/bottom detection circuit 200 of the first embodiment, three or more capacitors Cn and three or more switches SWn are provided, and states of the capacitors Cn are subsequently changed so that the states of the capacitors Cn are different from each other.

In the first embodiment, as described above, by switching the states of the capacitors Cn so that the states of the capacitors Cn are different from each other, and one of the capacitors Cn becomes a capacitor in the detection state.

By this configuration, according to the first embodiment, the detection state is not discontinued, and the occurrence of dead time is controlled. Therefore, according to the first embodiment, it is possible to successively output a detection result of the peak value or the bottom value.

Next, referring to FIG. 3A and FIG. 3B, a switch between the peak detection mode and the bottom detection mode by the controller 210 will be described.

Figures 3A, 3B:
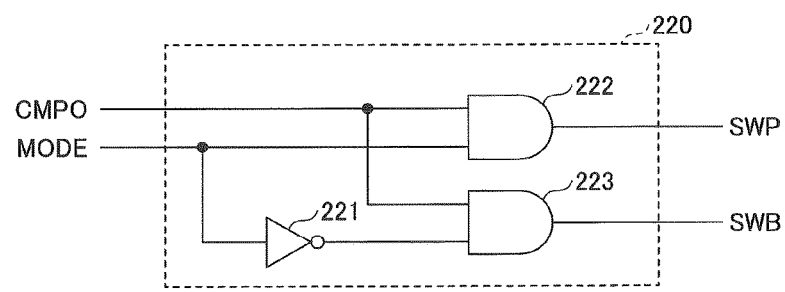
FIG. 3A and FIG. 3B are diagrams for explaining a switch between a peak detection mode and a bottom detection mode.

FIG. 3A and FIG. 3B are diagrams for explaining the switch between the peak detection mode and the bottom detection mode. FIG. 3A is a diagram for explaining the mode switching section 220 including the controller 210. FIG. 3B is a diagram for explaining values of the control signal SWP and the control signal SWB in each mode.

The mode switching section 220 of the first embodiment inputs the CMPO signal and the MODE signal, and outputs the control signal SWP and the control signal SWB. The control signal SWP is supplied to the switch SW4, and the control signal SWB is supplied to the switch SW5.

The mode switching section 220 of the first embodiment includes a NOT circuit 221, and AND circuits 222 and 223.

The CMPO signal is supplied to one input terminal of the AND circuit 222 and one input terminal of the AND circuit 223. The MODE signal is supplied to the other input terminal of the AND circuit 222 and an input terminal of the NOT circuit 221.

An output of the NOT circuit 221 is supplied to the other input terminal of the AND circuit 223. An output of the AND circuit 223 is supplied as the control signal SWB to the switch SW5.

In the first embodiment, as indicated by the truth table 31 in FIG. 3B, in a case in which the values of the MODE signal and the CMPO signal are the L level, the control signal SWP and the control signal SWB become the L level.

Also, as indicated in the truth table 31, in a case in which the MODE signal indicates the L level and the CMPO signal indicates the H level, the control signal SWP becomes the L level and the control signal SWB becomes the H level.

That is, in the first embodiment, in a case in which the value of the MODE signal is the L level, the control signal SWP maintains the L level, and, the switch SW4 becomes in a disconnection state. In other words, the peak/bottom detection circuit 200 discharges the voltage of the capacitor Cn and operates as the bottom detection mode for detecting the bottom value of the power voltage of the power source 201, when the value of the MODE signal is the L level.

Also, as indicated in the truth table 31, in a case in which the MODE signal indicates the H level and the value of the CMPO signal is the L level, both the control signal SWP and the control signal SWB become the L levels. Moreover, in a case in which the values of the MODE signal and the CMPO signal are the H level, the control signal SWP becomes the H level and the control signal SWB becomes the L level.

That is, in the first embodiment, in a case in which the value of the MODE signal is the H level, the control signal SWB maintains the L level and, the switch SW5 becomes in the disconnection state. In other words, when the value of the MODE signal is the H level, the peak/bottom detection circuit 200 charges the capacitor Cn by the power source 202, and operates as the peak detection mode for detecting the peak value of the power voltage of the power source 201.

Next, an operation of the peak/bottom detection circuit 200 will be described with reference to FIG. 4 and FIG. 5.

Figure 4:
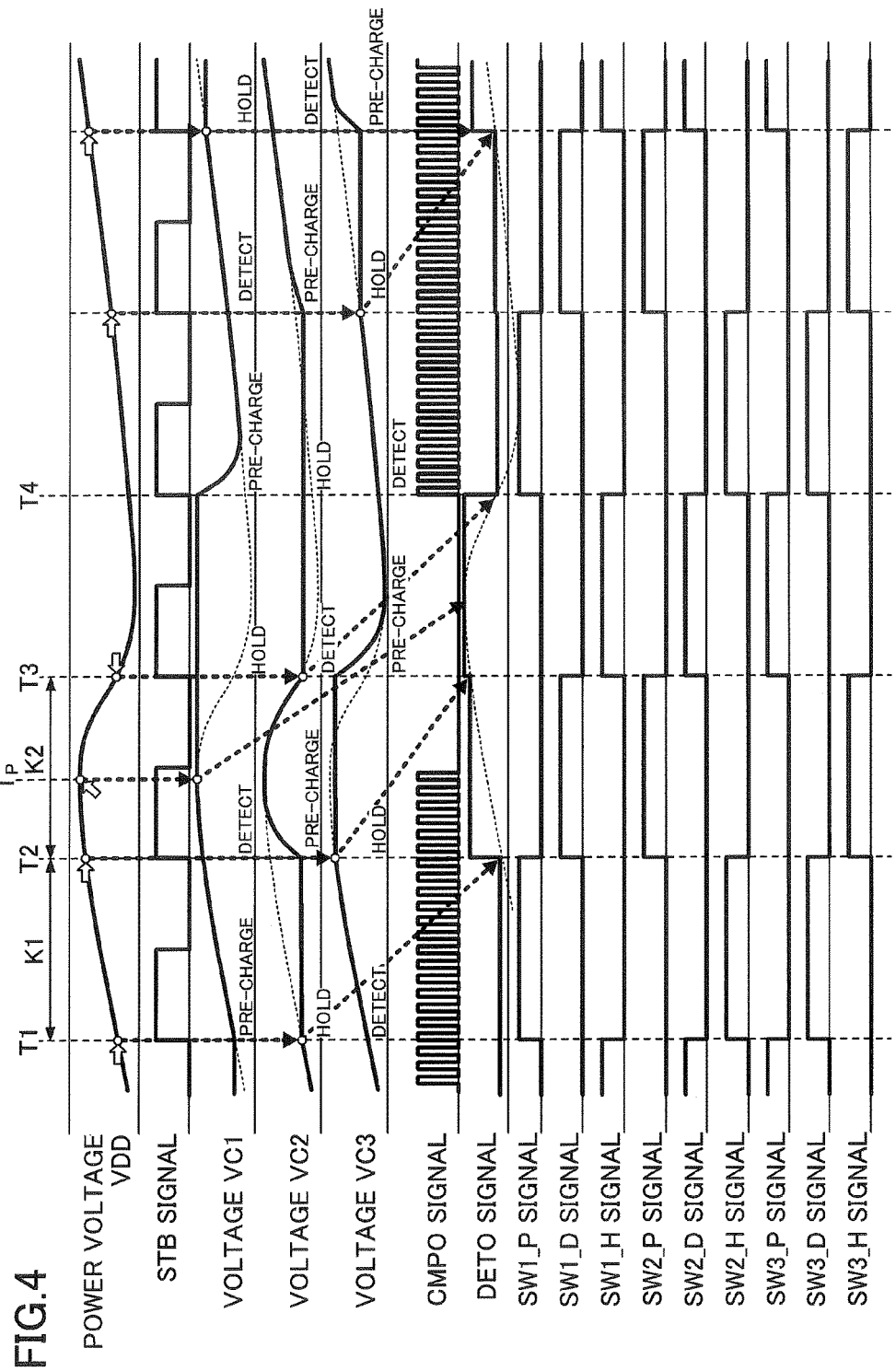
FIG. 4 is a timing chart for explaining an operation of a peak/bottom detection circuit in the peak detection mode.

FIG. 4 is a timing chart for explaining the operation of the peak/bottom detection circuit in the peak detection mode.

First, the operation of the peak/bottom detection circuit 200 in a section K1 from a timing T1 to a timing T2 will be described. The section K1 corresponds to one period of the STB signal. In other words, the timings Tn (n=1, 2, . . . ) in FIG. 4 are timings synchronizing rises of the STB signal. Accordingly, in the first embodiment, in the peak/bottom detection circuit 200, a period when the capacitor Cn is in the pre-charge state, a period when the capacitor Cn is in the detection state, and a period when the capacitor Cn is in the hold state correspond to one cycle of the STB signal, and time ratios are the same.

In an example in FIG. 4, at the timing T1, the value of the control signal SW1_P is the H level, and the values of the control signal SW1_D and the control signal SW1_H are the L level. Accordingly, in the section K1, the capacitor C1 becomes in the pre-charge state in which the capacitor C1 is connected to the power source 201 through the switch SW1, and a voltage VC1 increases.

Moreover, at the timing T1, the values of the control signal SW2_P and the control signal SW2_D are the L level, and the value of the control signal SW2_H is the H level. Accordingly, in the section K1, the capacitor C2 becomes in the hold state in which the capacitor C2 is connected to the calculation amplifier 206 through the switch SW2. In the section K1, the calculation amplifier 206 outputs the DETO signal depending on a voltage VC2 of the capacitor C2 to the A/D conversion section 300.

Moreover, at the timing T1, the values of the control signals SW3_P and the control signal SW3_H are the L level, and the value of the control signal SW3_D is the H level. Accordingly, in the section K1, the capacitor C3 becomes in the detection state in which the capacitor C3 is connected to the comparator 205 through the switch SW3. At this time, the capacitor C3 is charged by the current source 203 in order for a voltage VC3 to follow a power voltage VDD.

Next, a section K2 from the timing T2 to a timing T3 will be described. In the first embodiment, the controller 210 synchronizes with a rise of the STB signal, switches the values of the control signal SWn_P, the control signal SWn_D, and the control signal SWn_H, and subsequently switches the states of the capacitors C1 to C3 to be different from each other.

At the timing T2, the values of the control signal SW1_P and the control signal SW1_H are the L level, and the value of the control signal SW1_D is the H level. Accordingly, in the section K1, the capacitor C1 becomes in the detection state in which the capacitor C1 is connected to the comparator 205 through the switch SW1.

Also, at the timing T2, the value of the control signal SW2_P is the H level, and the values of the control signal SW2_D and the control signal SW2_H are the L level. Accordingly, in the section K2, the capacitor C2 becomes in the pre-charge state in which the capacitor C2 is connected to the power source 201 through the switch SW2.

Also, at the timing T2, the values of the control signal SW3_P and the control signal SW3_D are the L level, and the value of the control signal SW3_H becomes the H level. Accordingly, in a section K3, the capacitor C3 becomes in the hold state in which the capacitor C3 is connected to the calculation amplifier 206 through the switch SW3.

Referring to FIG. 4, at a timing Tp in the section K2, the peak value of the power voltage VDD is detected. The peak value is a value of the power voltage VDD where the voltage of the capacitor Cn applied to the inverting input terminal of the comparator 205 becomes higher than the power voltage VDD.

At the timing Tp, when the peak value is detected, the CMPO signal as the output signal of the comparator 205 becomes the L level.

Moreover, in the section K2, when the peak value is detected, the voltage VC1 of the capacitor C1 is maintained. At the timing T3, when the terminal C of the switch SW1 is connected to the terminal H and the capacitor C1 becomes in the hold state, the DETO signal depending on the voltage VC1 is output from the calculation amplifier 206, and is supplied to the A/D conversion section 300.

Moreover, at the timing T3, the connection destination of the terminal C of the switch SW2 is switched from the terminal P to the terminal D, and the capacitor C2 becomes in the detection state from the pre-charge state.

Also, at the timing T3, the connection destination of the terminal C of the switch SW3 is switched from the terminal H to the terminal P, and the state of the capacitor C3 is changed from the hold state to the pre-charge state whereby the voltage of the capacitor C3 follows the power voltage VDD.

By this operation, according to the first embodiment, it is possible to reduce power consumption for charging the capacitor Cn to follow the power voltage after the capacitor Cn is discharged. Also, according to the first embodiment, it is possible to reduce occurrences of noise due to an inrush charging current, which occurs during charging of the capacitor Cn after the voltage VCn of the capacitor Cn is reset.

Furthermore, in the first embodiment, by setting the capacitor Cn in the hold state for one period of the STB signal, it is possible to provide sufficient time for the A/D conversion section 300 to sample the voltage value of one of the capacitors Cn.

Next, an operation of the peak/bottom detection circuit 200 in the bottom detection mode will be described with reference to FIG. 5.

Figure 5:
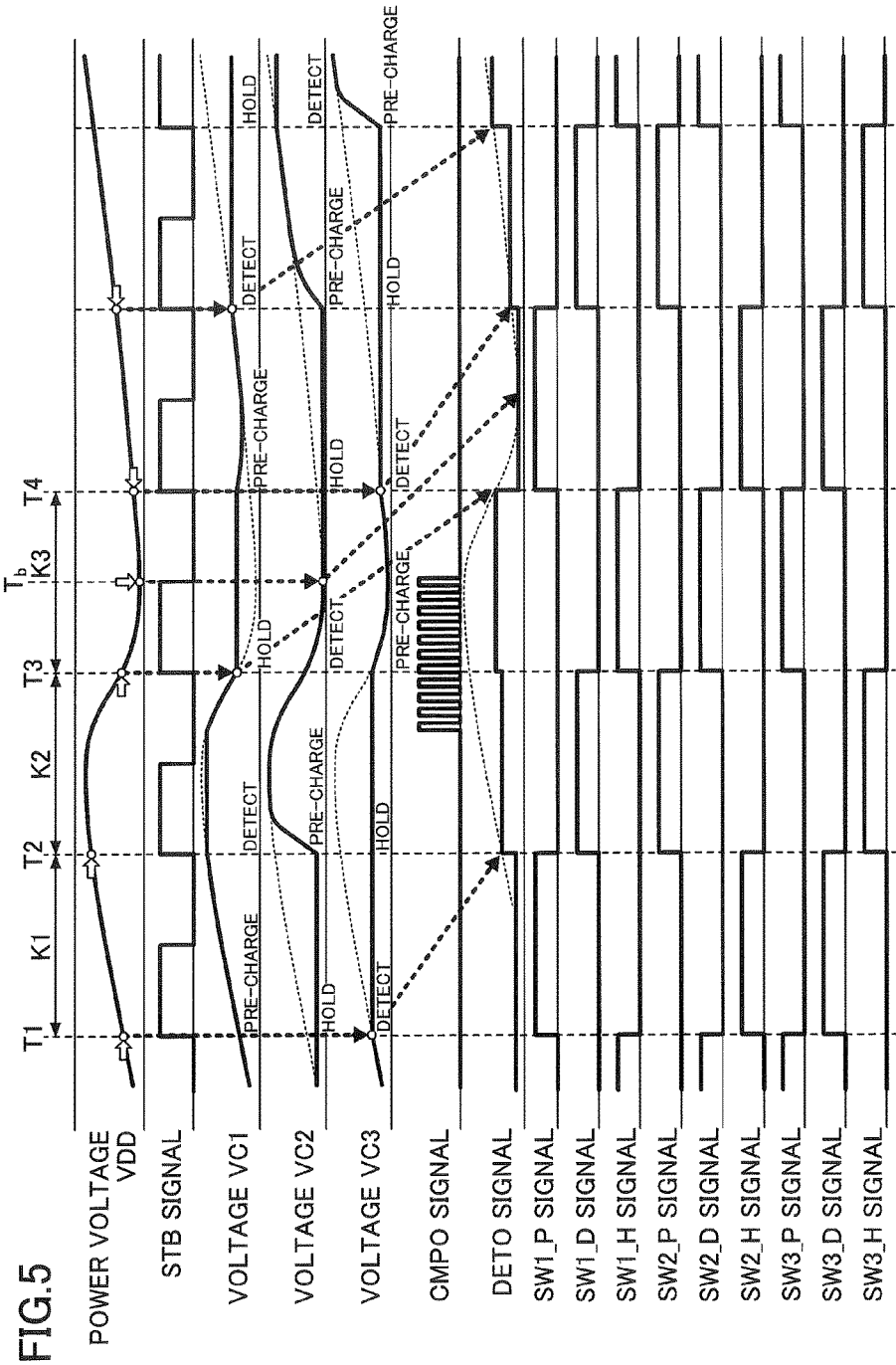
FIG. 5 is a timing chart for explaining an operation of the peak/bottom detection circuit in the bottom detection mode.

FIG. 5 is a timing chart for explaining the operation of the peak/bottom detection circuit in the bottom detection mode.

In FIG. 5, an example is depicted, in which the bottom value is detected at a timing Tb in the section K3 from the timing T3 to a timing T4.

The operations of the switches SW1 to SW3 are the same as FIG. 4. Referring to FIG. 5, in a case of the bottom detection mode, when the value of the power voltage VDD is greater than the voltage VCn of the capacitor Cn in the detection state, the CMPO signal is output. When the value of the power voltage VDD becomes lower than the voltage VCn of the capacitor Cn in the detection state, the value of the power voltage VDD is detected as the bottom value. Operations other than that described above are the same as those described in FIG. 4, and the explanation thereof will be omitted.

In the following, the comparator 205 and the calculation amplifier 206 will be described in reference to FIG. 6A, FIG. 6B, and FIG. 7.

FIG. 6A and FIG. 6B are diagrams for explaining an example of the comparator. The comparator 205 of the first embodiment is a clocked comparator. FIG. 6A illustrates an example of the comparator 205 at a reset operation, and FIG. 6B illustrates an example of the comparator 205 at a comparing operation.

The comparator 205 includes a P-channel transistor P1 and a P-channel transistor P2. The P-channel transistor P1 inputs an input signal IN1 to a gate, and supplies a current I1 to an output terminal OUT1. The P-channel transistor P2 inputs an input signal IN2, which is a determination value or a comparison result, to the gate, and supplies a current I2 to an output terminal OUT2. Sources of these transistors P1 and P2 are connected to a power source Vcc. The comparator 205 further includes an amplifier circuit that amplifies a voltage potential difference between the output terminals OUT1 and OUT2 based on the voltage potential difference between the output terminal OUT1 and the output terminal OUT2.

This amplifier circuit includes P-channel transistors P3 and P4 whose gates and drains are cross-connected, and N-channel transistors N5 and N6 whose gates and drains are cross-connected; thus, this current includes a latch function.

Also, the comparator 205 includes a pair of switches SW61 and SW62 that turn ON at the reset operation and cause the output terminals OUT1 and OUT2 to be a ground voltage. The switches SW61 and SW62 are in an ON state at the reset operation depicted in FIG. 6A, and the switches SW61 and SW62 are in an OFF state at the comparison operation depicted in FIG. 6B.

Figure 7:
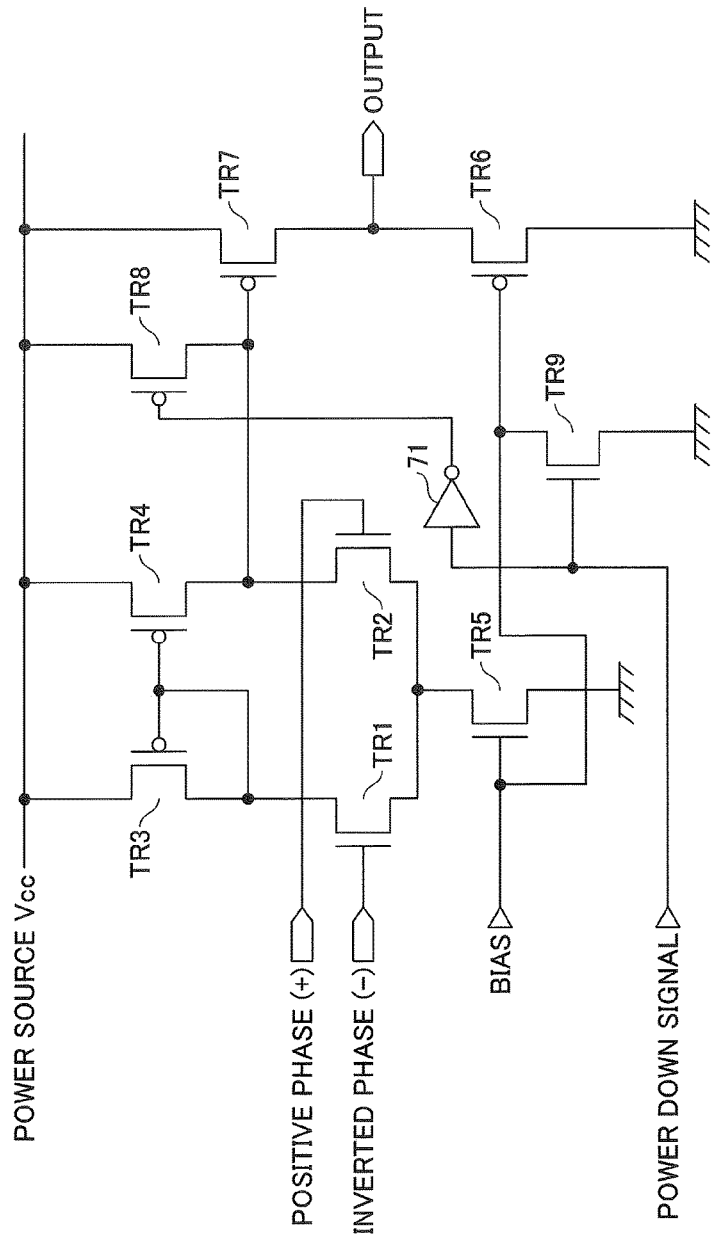
FIG. 7 is a diagram illustrating an example of a calculation amplifier.

FIG. 7 is a diagram illustrating an example of the calculation amplifier. The calculation amplifier 206 includes transistors TR1 through TR9 and an inverter 71. The Transistors TR1, TR2, TR5, and TR9 are N-channel transistors, and the transistors TR3, TR4, TR6, TR7, and TR8 are P-channel transistors.

An inverted phase input is applied to a gate of the transistor TR1, and a positive phase input is applied to a gate of the transistor TR2. A power down signal PD, which is inverted by the inverter 71, is applied to the transistor TR8. The power down signal PD is applied to the transistor TR9.

In the calculation amplifier 206, when the power down signal PD become active, the transistor TR8 and the transistor TR9 are turned on, and the transistor TR5 and TR6 and the transistor TR7 are turned off. An operation of the calculation amplifier 206 stops, and an output OUT becomes in a hi-impedance state.

The comparator 205 in FIG. 6A and FIG. 6B, and the calculation amplifier 206 in FIG. 7 are examples; thus, configurations of the comparator 205 and the calculation amplifier 206 in the first embodiment are not limited to the above described examples.

As described above, according to the first embodiment, by including three capacitors C1, C2, and C3 and subsequently switching the state of each of capacitors C1 to C3, it is possible to successively detect the peak value or the bottom value of the power voltage, and to reduce dead time.

Second Embodiment

A second embodiment will be described with reference to drawings. In the second embodiment, differently from the first embodiment, four or more capacitors Cn are provided. Hence, in the following, different portions from the first embodiment will be described, the same reference numerals as those used in the first embodiment are assigned to components having the same functional configuration as those of the first embodiment, and explanations thereof are omitted.

Figure 8:
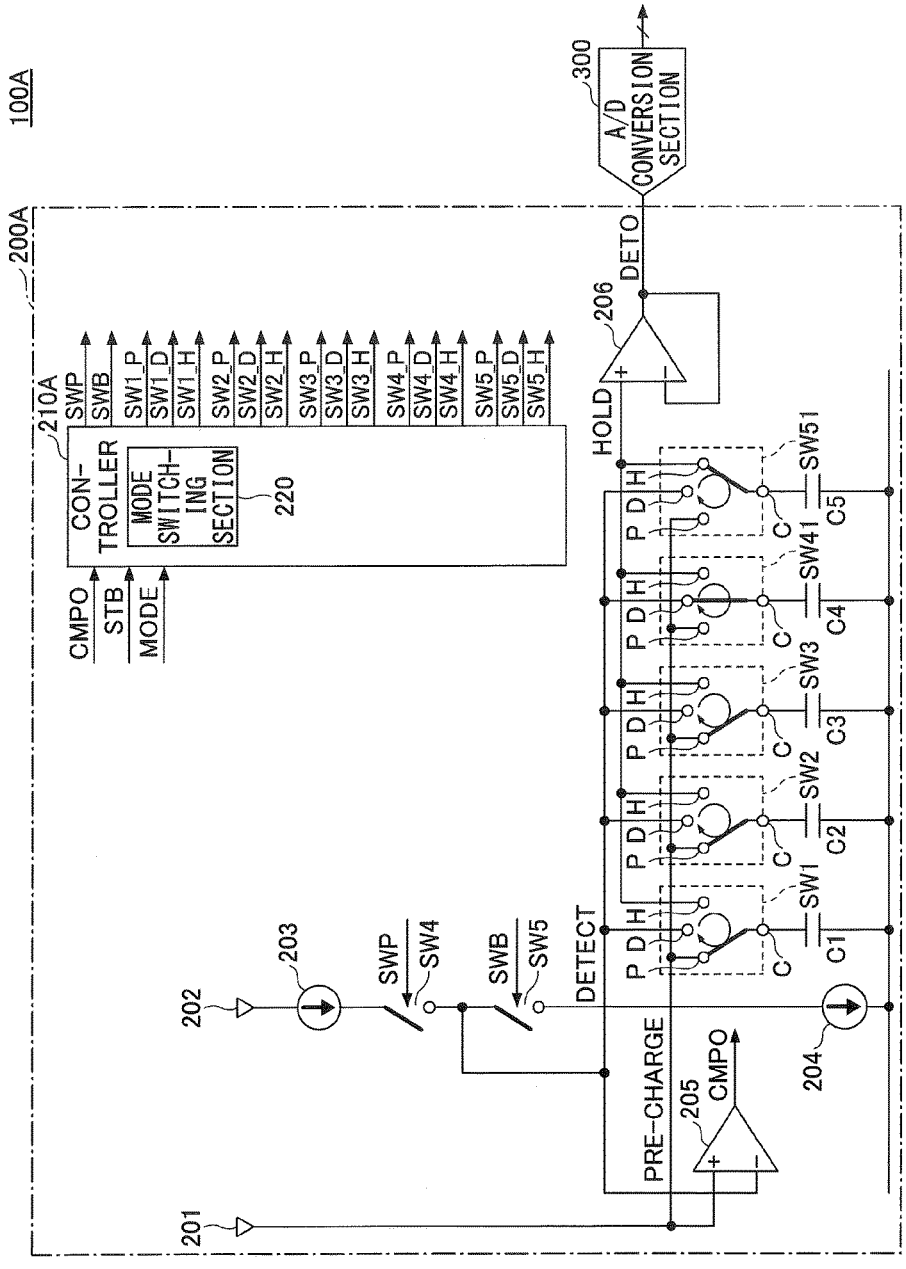
FIG. 8 is a diagram illustrating an A/D converter in a second embodiment.

FIG. 8 is a diagram illustrating an A/D converter in the second embodiment. An A/D converter 100A of the second embodiment includes a peak/bottom detection circuit 200A, and an A/D conversion section 300.

The peak/bottom detection circuit 200A of the second embodiment includes a controller 210A, the power sources 201 and 202, the current sources 203 and 204, the comparator 205, the calculation amplifier 206, the switches SW1 through SW5, a switch SW41, a switch SW51, and capacitors C1 through C5.

The controller 210A of the second embodiment outputs the control signals SWn_P, SWn_D, and SWn_H to define which of the terminal P, the terminal D, and terminal H is to be the connection destination of the terminal C for each of the switches SW1 through SW3, SW41, and SW51.

In the second embodiment, by providing five capacitors Cn with respect to three states: the pre-charge state, the detection state, and the hold state, it is possible to change the time ratios of a time of the pre-charge state, a time of the detection state, and a time of the hold state in the peak/bottom detection circuit 200A.

In an example in FIG. 8, among the capacitor C1 to the capacitor C5, the capacitors C1, C2, and C3 simultaneously become in the pre-charge state. In this state, a time when the capacitors C1 to C3 are in the pre-charge state corresponds to a time for one cycle of the STB signal. That is, in the second embodiment, three capacitors Cn exist to be pre-charged for the time of one cycle of the STB signal. This is equivalent to placing one capacitor Cn in the pre-charge state for a time of three cycles of the STB signal.

As described above, in the second embodiment, by simultaneously setting a plurality of capacitors Cn to be the same state, it is possible to change the time ratios of the time of the pre-charge state, the time of the detection state, and the time of the hold state.

In FIG. 8, the capacitors C1 to C3 are simultaneously set to be in the pre-charge state; however, this operation is not limited to this example. For instance, in the second embodiment, the capacitors C1 and C2 may be simultaneously set to be in the pre-charge state, and the capacitors C3 and C4 may be simultaneously set to be in the detection state.

In the second embodiment, as described above, it is possible to change the time ratio for each of the pre-charge state, the detection state, and the hold state. Hence, for instance, if the second embodiment is applied to a case of setting a time of the pre-charge or a settling time to be longer than a time for the A/D conversion section 300 to sample the voltage values of the capacitors Cn, it is possible to employ the A/D conversion section 300 more effectively.

Third Embodiment

In the following, a third embodiment will be described with reference to drawings. In the third embodiment, differently from the first embodiment, a plurality of the peak/bottom detection circuits described in the first embodiment are mounted in an integrated circuit. Hence, in the following, different portions from the first embodiment will be described, the same reference numerals as those used in the first embodiment are assigned to components having the same functional configuration as those of the first embodiment, and explanations thereof are omitted.

Figure 9:
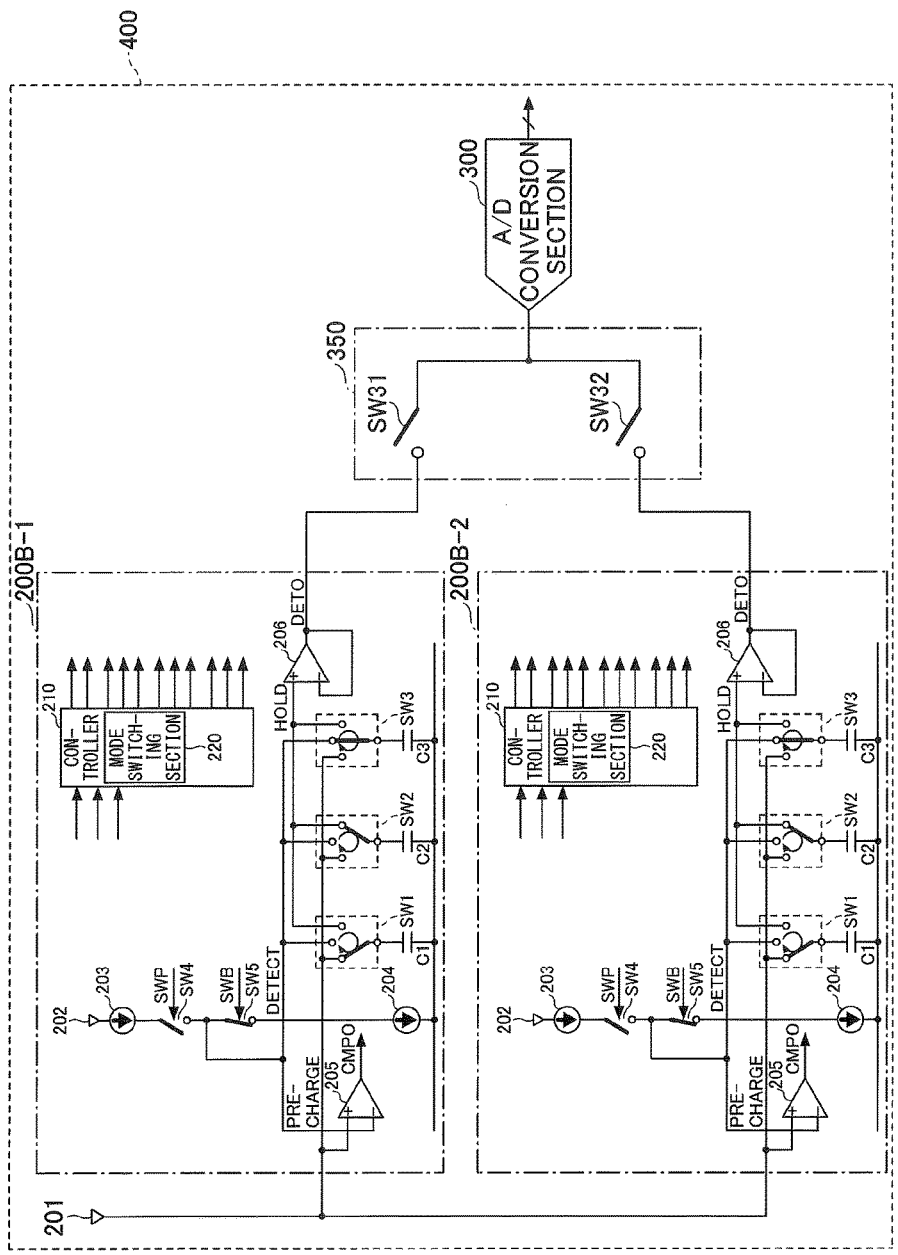
FIG. 9 is a first diagram illustrating an example of an integrated device of a third embodiment.

FIG. 9 is a first diagram illustrating an example of an integrated device of the third embodiment. The integrated circuit 400 of the third embodiment includes a plurality of peak/bottom detection circuits including at least a peak/ bottom detection circuit 200B-1 and a peak/bottom detection circuit 200B-2, the A/D conversion section 300, and a switch circuit 350.

In the third embodiment, different from the peak/bottom detection circuit 200 of the first embodiment, a plurality of the peak/bottom detection circuits 200B, which are the peak/bottom detection circuit 200B-1 and the peak/bottom detection circuit 200B-2, share the power source 201.

Also, in the integrated circuit 400 of the third embodiment, the switch circuit 350 includes switches SW31 and SW32. The switch SW31 switches a connection and a disconnection between the peak/bottom detection circuit 200B-1 and the A/D conversion section 300. The switch SW32 switches a connection and a disconnection between the peak/bottom detection circuit 200B-2 and the A/D conversion section 300.

The switch circuit 350 may control ON or OFF of the switch SW31 and the switch SW32 by a switch control signal input from a high-level circuit (not shown) of the integrated circuit 400. For instance, by the switch circuit 350 alternately turning on the switch SW31 and the switch SW 32, it is possible to convert voltages, which are output from both the peak/bottom detection circuit 200B-1 and the peak/bottom detection circuit 200B-2, into digital values.

Figure 10:
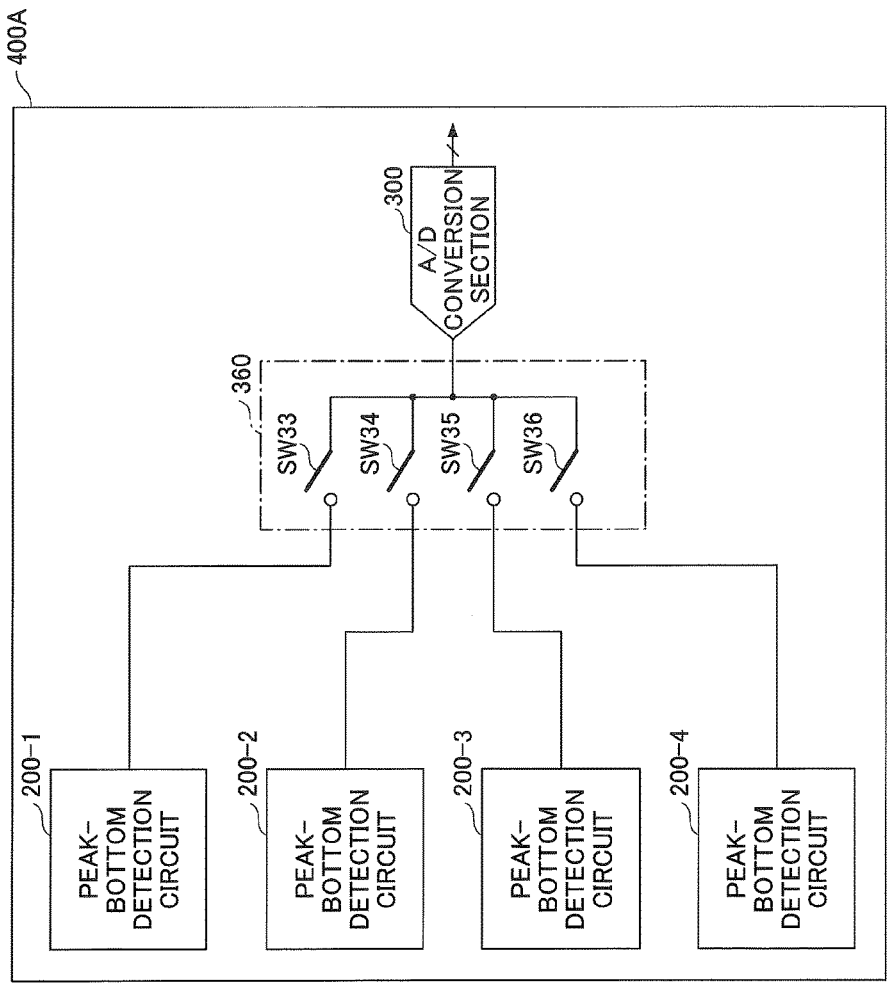
FIG. 10 is a second diagram illustrating the example of the integrated device of the third embodiment.

FIG. 10 is a second diagram illustrating the example of the integrated device of the third embodiment. An integrated circuit 400A depicted in FIG. 10 includes peak/bottom detection circuits 200-1 through 200-4, and the A/D conversion section 300, and the switch circuit 360.

In the integrated circuit 400A, the switch circuit 360 includes switches SW33, SW34, SW35, and SW36.

The switch SW33 switches a connection and a disconnection between the peak/bottom detection circuit 200-1 and the A/D conversion section 300, and the switch SW34 switches a connection and a disconnection between the peak/bottom detection circuit 200-2 and the A/D conversion section 300. Moreover, the switch SW35 switches a connection and a disconnection between the peak/bottom detection circuit 200-3 and the A/D conversion section 300, and the switch SW36 switches a connection and a disconnection between the peak/bottom detection circuit 200-4 and the A/D conversion section 300.

A switch control signal may be supplied to instruct switching of the switches SW33 to SW36 from a high-level circuit (not shown) of the integrated circuit 400A, and the switch circuit 360 may sequentially switch the switches SW33 to SW36 in response to this switch control signal.

Moreover, in the integrated circuit 400A, from this high-level circuit, an output instruction signal for instructing to output the DETO signal may be supplied with respect to the peak/bottom detection circuits 200-1 to 200-4.

In this case, the switch control signal supplied to the switch circuit 360 and the output instruction signal supplied to the peak/bottom detection circuits 200-1 to 200-4 are synchronized signals. Specifically, for instance, in a case in which the switch SW33 is turned on and the peak/bottom detection circuit 200-1 and the A/D conversion section 300 are connected, the output instruction signal of the DETO signal may be supplied to the peak/bottom detection circuit 200-1.

In the example depicted in FIG. 10, four peak/bottom detection circuits 200 are mounted in the integrated circuit 400A; however, a configuration is not limited to this example. Any number of the peak/bottom detection circuits 200 may be mounted in the integrated circuit 400A.

Figure 11:
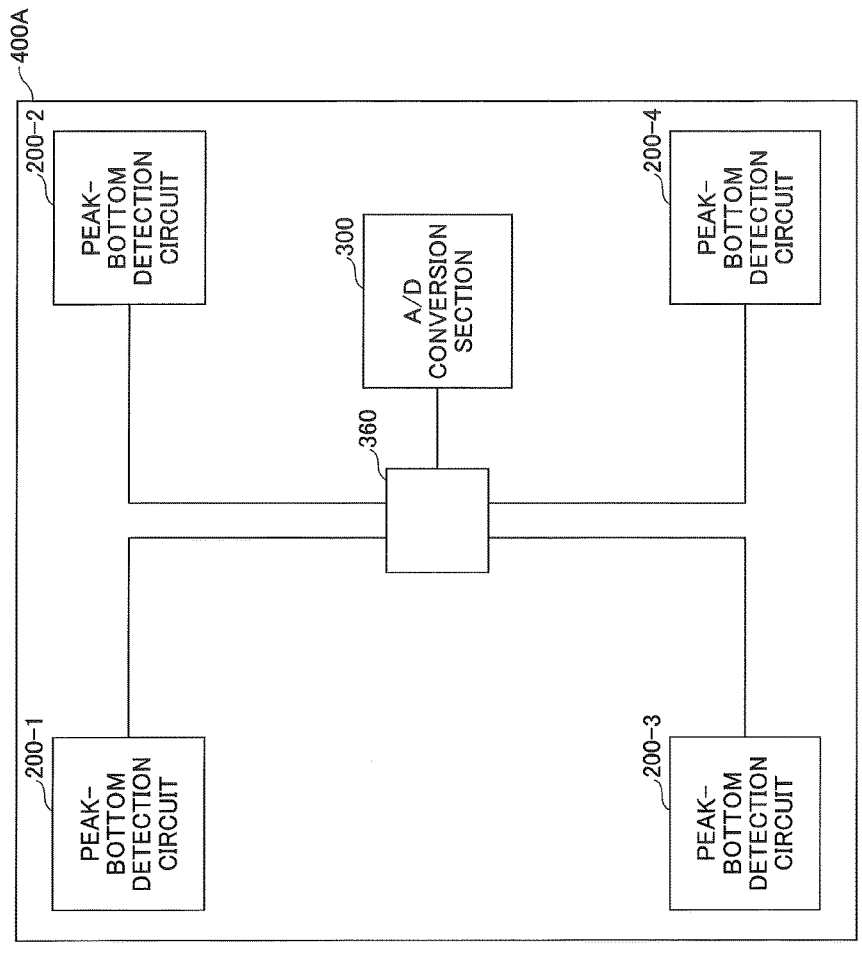
FIG. 11 is a diagram illustrating an example of an arrangement of peak/bottom detection circuits in an integrated circuit.

FIG. 11 is a diagram illustrating an example of an arrangement of the peak/bottom detection circuits in the integrated circuit. In FIG. 11, the example of the arrangement of the peak/bottom detection circuits 200-1 to 200-4 in the integrated circuit 400A is depicted.

In the integrated circuit 400A, for instance, the peak/bottom detection circuits 200-1 to 200-4 may be deployed at four corners of the integrated circuit 400A, respectively. In other words, the peak/bottom detection circuits 200-1 to 200-4 may be deployed in vicinities of edges of a substrate of the integrated circuit 400A.

In the third embodiment, by deploying the peak/bottom detection circuits 200-1 to 200-4 as described above, for instance, it is possible to detect the peak value or the bottom value of the power voltage at different positions with respect to a power source line formed on the substrate.

In this case, for instance, it is preferable that each of the peak/bottom detection circuits 200 is deployed in a vicinity or the like of a circuit having a greater power consumption, from among circuits executed by the integrated circuit 400A. Also, in a case of detecting the power voltage at different positions on the power source line, it is preferable that the peak/bottom detection circuits 200 are distributed and arranged on the substrate of the integration circuit 400A.

According to the first embodiment to the third embodiment, it is possible to suppress occurrences of dead time.

Although the present invention has been described based on the respective embodiments, the present invention is not limited to requirements described in the above embodiments. Regarding these points, it is possible to change the scope of the present invention within the scope not to obscure it, and requirements can be appropriately determined according to an application form.

What is claimed is:

1. A peak/bottom detection circuit, comprising:
   three or more capacitors;
   a comparator configured to compare a voltage of one of the three or more capacitors with an input voltage;
   a calculation amplifier configured to amplify a voltage of one of the three or more capacitors;
   three or more switches respectively corresponding to the three or more capacitors, each of the three or more switches configured to connect a corresponding capacitor among the three or more capacitors to one of the comparator, the calculation amplifier, and a source of the input voltage; and
   a controller configured to generate control signals for sequentially switching connection destinations of the three or more capacitors and to supply the control signals to the three or more switches, respectively, in which the connection destinations of three capacitors among the three or more capacitors are different from each other.

2. The peak/bottom detection circuit as claimed in claim 1, wherein the controller generates the control signals based on an output signal of the comparator, which is input to the controller, and a timing signal for reading a voltage of a capacitor connected to the calculation amplifier among the three or more capacitors.

3. The peak/bottom detection circuit as claimed in claim 1,
   wherein a number of the three or more capacitors is four or more, a number of the three or more switches is four or more; and
   wherein the controller generates the control signals for the connection destinations of at least two capacitors to be the same among four or more capacitors.

4. The peak/bottom detection circuit as claimed in claim 1, wherein for each of the three or more capacitors, a connection destination is switched in an order of the source of the input voltage, the comparator, and the calculation amplifier; and the connection destination is next switched to the source of the input voltage from the calculation amplifier.

5. An analog to digital converter, comprising:
a peak/bottom detection circuit; and
an analog to digital conversion section, wherein the peak/bottom detection circuit includes
    three or more capacitors;
    a comparator configured to compare a voltage of one of the three or more capacitors with an input voltage;
    a calculation amplifier configured to amplify a voltage of one of the three or more capacitors;
    three or more switches respectively corresponding to the three or more capacitors, each of the three or more switches configured to connect a corresponding capacitor among the three or more capacitors to one of the comparator, the calculation amplifier, and a source of the input voltage; and
    a controller configured to generate control signals for sequentially switching connection destinations of the three or more capacitors and to supply the control signals to the three or more switches, respectively, in which the connection destinations of three capacitors among the three or more capacitors are different from each other,
wherein the analog to digital conversion section is connected to a latter stage of the calculation amplifier.

6. An integrated circuit, comprising:
a plurality of peak/bottom detection circuits;
an analog to digital section connected to a latter stage of the plurality of peak/bottom detection circuits; and
a switch circuit,
wherein each of the plurality of peak/bottom detection circuits includes
    three or more capacitors;
    a comparator configured to compare a voltage of one of the three or more capacitors with an input voltage;
    a calculation amplifier configured to amplify a voltage of one of the three or more capacitors;
    three or more switches respectively corresponding to the three or more capacitors, each of the three or more switches configured to connect a corresponding capacitor among the three or more capacitors to one of the comparator, the calculation amplifier, and a source of the input voltage; and
    a controller configured to generate control signals for sequentially switching connection destinations of the three or more capacitors and to supply the control signals to the three or more switches, respectively, in which the connection destinations of three capacitors among the three or more capacitors are different from each other.

7. The integrated circuit as claimed in claim 6, wherein the three or more peak/bottom detection circuits are deployed in vicinities of edges of a substrate of the integrated circuit, respectively.

* * * * *